(12) United States Patent
Ikaheimo

(10) Patent No.: US 11,391,775 B2
(45) Date of Patent: Jul. 19, 2022

(54) CONDITION MONITORING DEVICE FOR AN ELECTRICAL MACHINE

(71) Applicant: ABB Schweiz AG, Baden (CH)

(72) Inventor: Jouni Ikaheimo, Kurikka (FI)

(73) Assignee: ABB Schweiz AG, Baden (CH)

( * ) Notice: Subject to any disclaimer, the term of this patent is extended or adjusted under 35 U.S.C. 154(b) by 351 days.

(21) Appl. No.: 16/499,117

(22) PCT Filed: Mar. 26, 2018

(86) PCT No.: PCT/IB2018/052025
§ 371 (c)(1),
(2) Date: Sep. 27, 2019

(87) PCT Pub. No.: WO2018/178839
PCT Pub. Date: Oct. 4, 2018

(65) Prior Publication Data
US 2021/0088589 A1 Mar. 25, 2021

(30) Foreign Application Priority Data

Mar. 28, 2017 (IN) .............................. 201741010954

(51) Int. Cl.
*G01R 31/34* (2020.01)
*H02K 11/25* (2016.01)

(52) U.S. Cl.
CPC .............. *G01R 31/34* (2013.01); *H02K 11/25* (2016.01)

(58) Field of Classification Search
CPC ........ G01R 31/34; H02K 11/25; H02K 11/00; H02K 11/0094; H02K 11/20; H02K 11/21; H02K 11/215; H02K 11/225; H02K 11/24; H02K 11/26; H02K 11/27; H02K 29/06; H02K 29/14; H02J 50/10
See application file for complete search history.

(56) References Cited

U.S. PATENT DOCUMENTS 4,082,968 A * 4/1978 Jones ..................... H02K 23/04
310/113
6,323,619 B1 * 11/2001 El-Ibiary ............... F16C 41/007
320/107

(Continued)

FOREIGN PATENT DOCUMENTS

DE 102014018485 B3 9/2015

OTHER PUBLICATIONS

PCT International Search Report & Written Opinion for PCT/IB2018/052025, dated Jul. 5, 2018, 9 pages.

*Primary Examiner* — Son T Le

(74) *Attorney, Agent, or Firm* — Leydig, Voit & Mayer, Ltd.

(57) ABSTRACT

In aspects, the present invention provides a condition monitoring device for monitoring a condition of an electrical machine. The condition monitoring device comprises a housing affixed on a frame of the electrical machine, one or more sensors within the housing, for measuring one or more parameters of the electrical machine, and one or more magnetic coils electrically connected to an electrical energy storage unit located in the housing. The one or more magnetic coils are located within a cavity in the stator core thorough an aperture in the frame of the electrical machine and form an inductive circuit with one or more windings of the electrical machine, for supplying current to the electrical energy storage unit.

6 Claims, 2 Drawing Sheets

(56) References Cited

U.S. PATENT DOCUMENTS

2015/0357778 A1 12/2015 Steinbach et al.
2016/0211634 A1 7/2016 Fish et al.
2018/0171119 A1 6/2018 Takano et al.

* cited by examiner

CONDITION MONITORING DEVICE FOR AN ELECTRICAL MACHINE

CROSS-REFERENCE TO RELATED APPLICATIONS

This application is a national stage entry under 35 U.S.C. § 371 of PCT International Stage Patent Application No. PCT/IB2018/052025, filed Mar. 26, 2018, which claims priority to Indian Patent Application No. 201741010954, filed Mar. 28, 2017. The entire disclosures of each of the foregoing application are incorporated herein by reference.

FIELD OF THE INVENTION

The present invention relates to condition monitoring devices. More particularly, the present invention relates to self-powered condition monitoring devices installed on electrical machines.

BACKGROUND

Asset management and condition monitoring of electrical machines are performed using sensors and condition monitoring devices which may be handheld or may be installed on electric equipment. Conventionally, condition monitoring devices which are installed on the electrical machines, are powered by batteries located within the device and/or by electrical connections from the terminal box of the electric machines.

To be powered by the terminal box, electrical connections have to be made from the device to the terminal box of motor during installation of the condition monitoring device or the sensor device. This requires that the motor be taken offline during installation which results in downtime during installation. Moreover, incorrect wiring may result in damage to the device or the electrical machine itself. To overcome this issue, more and more devices are completely powered by batteries within the device itself.

However, due to the low power available on the battery/s, the device has to operate in low-power modes. In such circumstances connection protocols which have high data rate and high energy (such as WIFI) usage have to be avoided. Additionally, due to the limited life of the battery, the device will require periodic change of battery to ensure device availability. This is often not desired.

Therefore, in light of the abovementioned discussion, there is a need for a condition monitoring device that satisfies the above mentioned problems.

BRIEF DESCRIPTION OF THE INVENTION

The above-mentioned shortcomings, disadvantages and problems are addressed herein which will be understood by reading and understanding the following specification.

In one aspect, the present invention provides a condition monitoring device for monitoring a condition of an electrical machine. The condition monitoring device comprises a housing affixed on a frame of the electrical machine, one or more sensors within the housing, for measuring one or more parameters of the electrical machine, and one or more magnetic coils electrically connected to an electrical energy storage unit located in the housing. The one or more magnetic coils are located within a cavity in the stator core thorough an aperture in the frame of the electrical machine and form an inductive circuit with one or more windings of the electrical machine, for supplying current to the electrical energy storage unit.

In an embodiment, an axis of symmetry of a first magnetic coil from the one or more magnetic coils, is parallel to a first axis, and an axis of symmetry of a second magnetic coil from the one or more magnetic coils, is perpendicular to the first axis. In an embodiment, the housing of the condition monitoring device comprises a screw bolt having an external thread capable of coupling with an internal thread located within the cavity of the stator core, for locking the stator core with the frame of the electrical machine and for affixing the condition monitoring device on the electrical machine. A temperature sensor is housed with a hollow chamber in the screw bolt, and is configured to measure temperature within the electrical machine. Similarly, in an embodiment, the screw bolt includes a hollow chamber for containing the one or more magnetic coils.

Systems and methods of varying scope are described herein. In addition to the aspects and advantages described in this summary, further aspects and advantages will become apparent by reference to the drawings and with reference to the detailed description that follows.

DETAILED DESCRIPTION

In the following detailed description, reference is made to the accompanying drawings that form a part hereof, and in which is shown by way of illustration specific embodiments, which may be practiced. These embodiments are described in sufficient detail to enable those skilled in the art to practice the embodiments, and it is to be understood that other embodiments may be utilized and that logical, mechanical, electrical and other changes may be made without departing from the scope of the embodiments. The following detailed description is, therefore, not to be taken in a limiting sense.

The current invention discloses a condition monitoring device which is capable of being powered wirelessly through inductive means, by the electrical machine. Accordingly, the electrical machine itself acts a source of energy which can be tapped to power up the condition monitoring device, thereby doing away with the need for galvanic connection. These aspects are further explained below.

Figure 2:
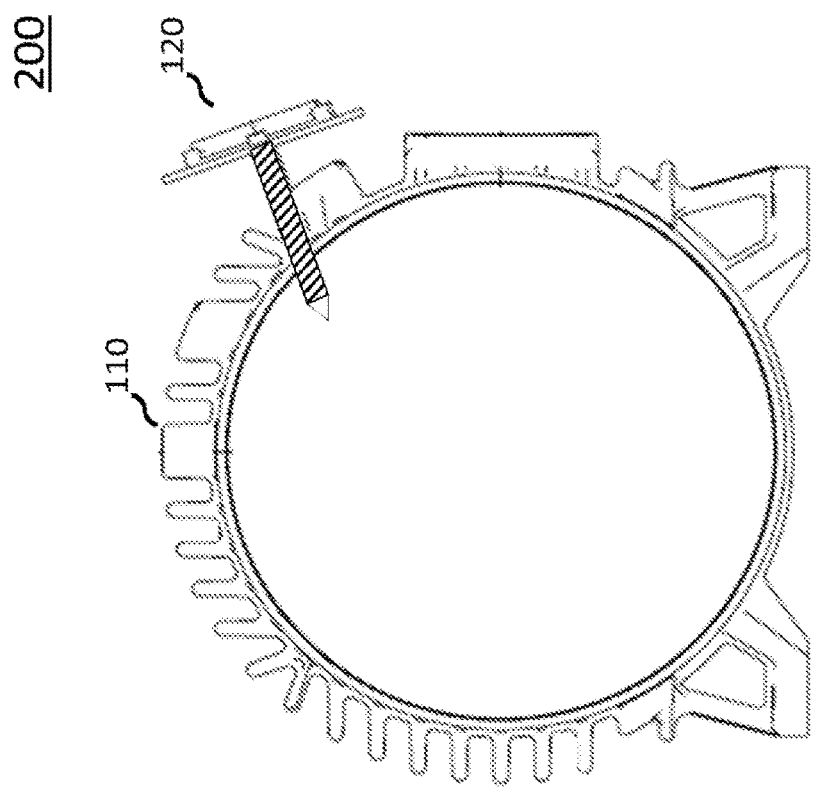
FIG. 2 illustrates a sectional view of the condition monitoring device installed on the electrical machine, in accordance with various embodiments of the present invention.
Figure 1:
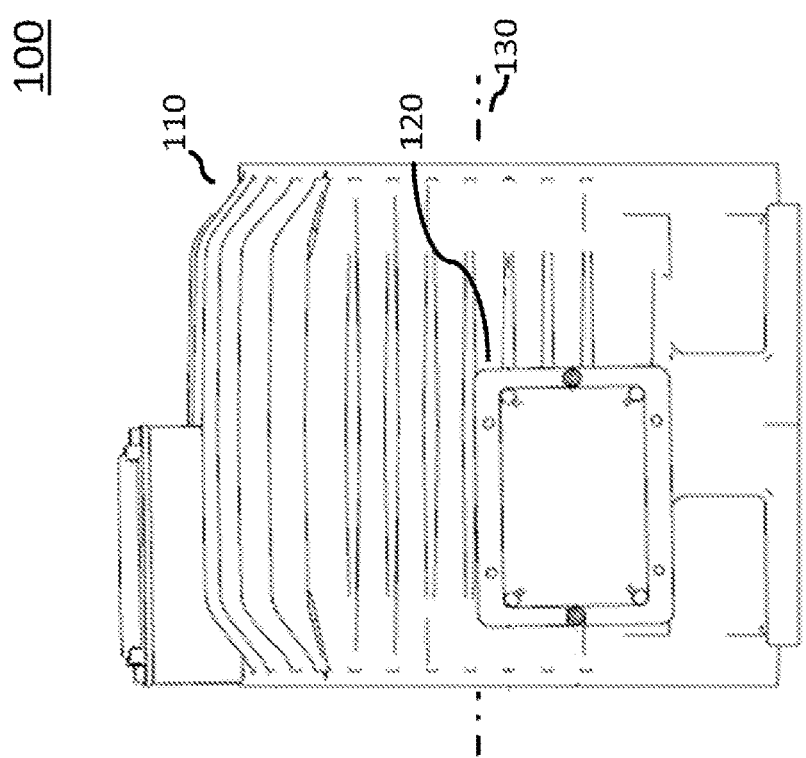
FIG. 1 illustrates a front view of a condition monitoring device installed on an electrical machine, in accordance with various embodiments of the present invention.

FIG. 1 and FIG. 2 respectively illustrates a front view 100 and a sectional view 200 of a condition monitoring device 120 installed on an electrical machine 110, in accordance with various embodiments of the present invention. In an example, the electrical machine 110 is an electrical motor 110 having axis of rotation 130 (also referred to as rotational axis 130).

The condition monitoring device 120 comprise a housing (shown in FIG. 3 as housing 310) affixed on a frame of the electrical machine 110, one or more sensors (not shown in figures) for measuring one or more parameters of the electrical machine 110, one or more processors (shown in FIG. 3 as processor 320) for receiving measurements from the sensors and for determining the condition of the electrical machine 110 and a network interface (shown in FIG. 3 as network interface 330) for communicating the condition of the electrical machine 110 to operator devices or a server (not shown in figures).

The one or more sensors housed within the housing of the electrical machine. In an embodiment, the one or more sensors includes a temperature sensor, magnetic field sensors, acoustic sensor, and vibration sensor. The sensors, the processor 320 and the network interface 330 are powered by an energy source or power source 340. In an embodiment, the power source 340 includes an electrical energy storage unit.

Figure 3:
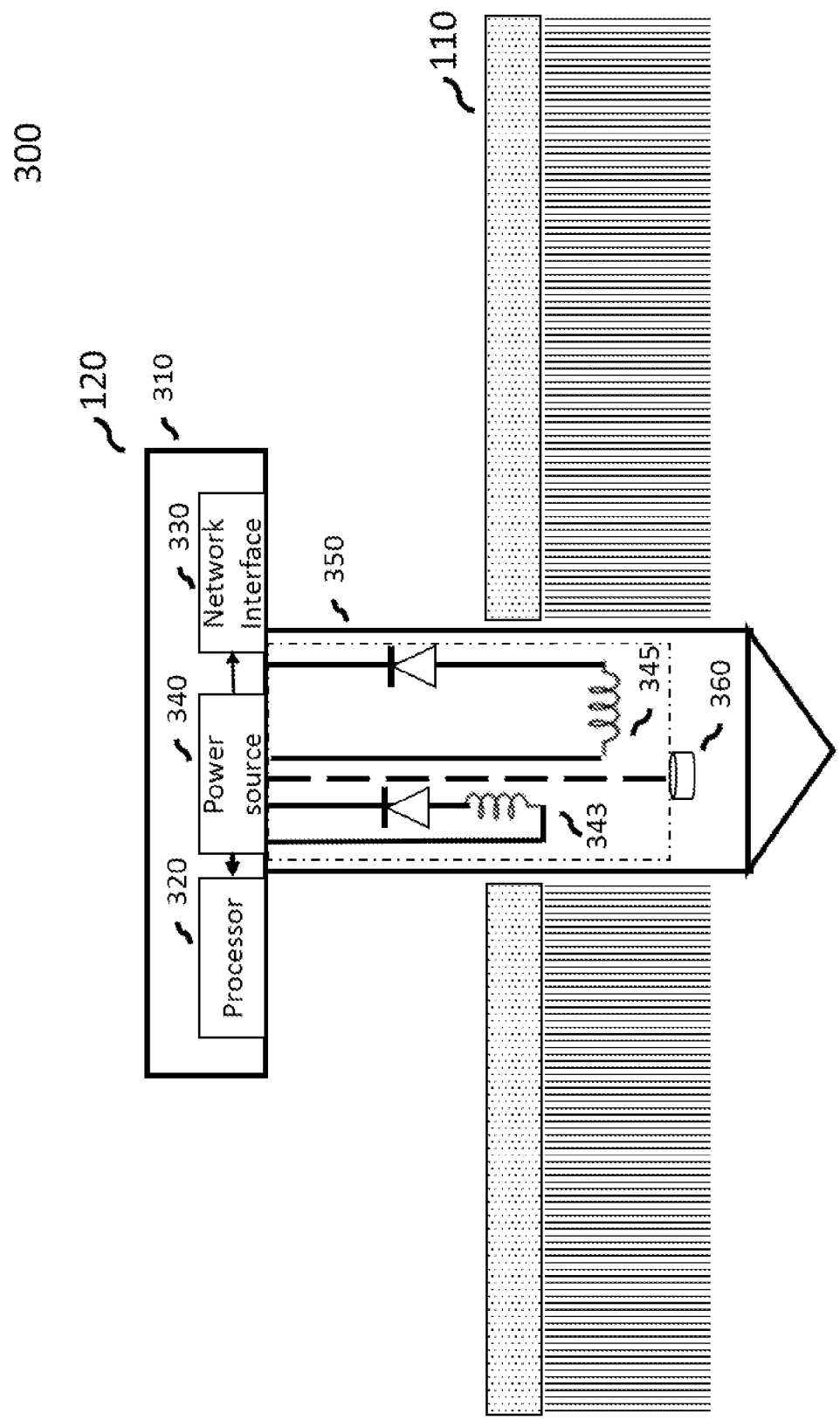
FIG. 3 illustrates the condition monitoring device, in accordance with various embodiments of the present invention.

The housing 310 of the condition monitoring device 120 is affixed to the frame of the motor 110 using a screwbolt (shown in FIG. 3 as screwbolt 350). The screwbolt 350 is also referred to as a mounting screw or a lock screw and is made of non ferromagnetic material such as stainless steel. The screwbolt 350 of the condition monitoring device 120 located within the frame and stator core of the motor 110.

During the installation of the condition monitoring device 120 on the motor 110, a hole is drilled into the frame of the motor 110. The drilling is continued till a cavity of sufficient depth is created within the stator core of the motor 110. In an embodiment, an internal screw thread is tapped in opening in the frame and the cavity in the stator core of the motor 110. The screw bolt 350 comprises an external thread capable of coupling with the internal thread located within the drilled cavity of the stator core, for locking the stator core with the frame of the motor 110 and for affixing the condition monitoring device 120 on the motor 110. Subsequent to the tapping of the screw thread, the screw bolt 350 of the condition monitoring device 120 is screwed onto the screw thread in the frame and stator core of the motor 110. In another embodiment, the screw bolt 350 is secured in the stator core by using epoxy or other additive means within the cavity of the stator core. The screwbolt 350 prevents the stator core from rotating with respect to the frame of the motor 110.

For harvesting energy from the motor 110, the condition monitoring device 110 contains one or more magnetic coils (shown in FIG. 3 as magnetic coils 343 and 345) electrically connected to the electrical energy storage unit of the power source 340. The screwbolt 350 contains a hollow chamber within which the magnetic coils 343 and 345 are contained. In an embodiment, the magnetic coils 343 and 345 are held within the hollow chamber of the screw bolt 350 using epoxy.

Upon installing the condition monitoring device 120 on the electrical machine 110, the magnetic coils 343 and 345 are located within the cavity in the stator core thorough the aperture in the frame of the electrical machine. The magnetic coils 343 and 345 form an inductive circuit with one or more windings of the motor 110 (when the motor 110 is powered on), for supplying current to the electrical energy storage unit of the condition monitoring device 110.

Since the screwbolt 350 is non-ferromagnetic, the magnetic flux generated within the motor penetrates the hollow chamber of screwbolt 350 and couples with the magnetic coils 343 and 345. The magnetic coils are located inside the stator core where the flux density is typically 1 Tesla, whereas outside the housing it can be 1000 times weaker, and thereby enable effective harvesting of energy from the motor 110.

In an embodiment, a power conversion device is provided for converting the electrical power from the magnetic coils 343 and 345 and provided the converted power to the electrical energy storage unit. In another embodiment, one or more diodes are provided between the magnetic coils and the electrical energy storage unit, for ensuring unidirectional flow of energy from the coils to the electrical energy storage unit and for rectification of current from the magnetic coils. It is to be noted by a person skilled in the art that while a half-wave rectifier circuit is utilized in the circuit configuration of the condition monitoring device 120 shown on FIG. 2, a full wave rectification circuit using four diodes may also be used as well for converting the power induced in the coils. Similarly, various other means for rectification may be used along with the coils 343 and 345.

In an embodiment, axis of symmetry of the magnetic coil 343 is parallel to a first axis, and an axis of symmetry of a second magnetic coil from the one or more magnetic coils, is perpendicular to the first axis. The first axis is parallel to the rotational axis 130 of the motor 110. In an embodiment, one of the loops has maximum 45 degrees angle to the flux vector of the magnetic field of the motor 110, regardless of the screw bolt's rotational position, by which the coil is at a 45 degree angle to the magnetic flux vectors in the stator core (which are tangential to the motor rotational axis). This way, the electromotive force generated in either of the coils is larger than N (number of turns)×A (cross section of the coil)×Sin(45 degrees)×change rate of the flux density.

In an embodiment, the temperature sensor 360 is housed with the hollow chamber of the screw bolt 350. By providing the temperature sensor 360 within the screw bolt 350 which is inserted into the motor 110, the temperature sensor 360 is capable of measuring the core temperature of the motor 110 accurately.

This written description uses examples to describe the subject matter herein, including the best mode, and also to enable any person skilled in the art to make and use the subject matter. The patentable scope of the subject matter is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A condition monitoring device for monitoring a condition of an electrical machine, the condition monitoring device comprising:
   a housing affixed on a frame of the electrical machine;
   one or more sensors for measuring one or more parameters of the electrical machine, the one or more sensors housed within the housing of the electrical machine;
   one or more magnetic coils electrically connected to an electrical energy storage unit located in the housing, the one or more magnetic coils located within a cavity in the stator core thorough a aperture in the frame of the electrical machine;
   wherein the magnetic coils form an inductive circuit with one or more windings of the electrical machine, for supplying current to the electrical energy storage unit;
   wherein an axis of symmetry of a first magnetic coil from one or more of the magnetic coils is parallel to a first axis, and an axis of symmetry of a second magnetic coil from the one or more magnetic coils, is perpendicular to the first axis, wherein the first axis is parallel to the rotational axis of the electrical machine.

2. The condition monitoring device of claim 1, wherein the housing comprises a screw bolt having an external thread capable of coupling with an internal thread located within the cavity of the stator core, for locking the stator core with the frame of the electrical machine and for affixing the condition monitoring device on the electrical machine.

3. The condition monitoring device of claim 1, wherein the condition monitoring device further comprises one or more processors configured to receive measurements from the one or more sensors and determine the condition of the electrical machine, and a network interface configured to communicate with a server; wherein the at least one of the one or more sensors, one or more processors and the network interface is powered by the electrical energy storage unit.

4. The condition monitoring device of claim 1, wherein the axis of symmetry of one of the first magnetic coil and the second magnetic coil is substantially at a forty five degree angle with a flux vector of the magnetic field generated within the electrical machine.

5. The condition monitoring device of claim 2, wherein the screw bolt includes a hollow chamber for containing the one or more magnetic coils.

6. The condition monitoring device of claim 2, wherein the one or more sensors includes a temperature sensor, housed with a hollow chamber in the screw bolt, configured to measure temperature within the electrical machine.

* * * * *